United States Patent [19]

Crane

[11] 4,012,832
[45] Mar. 22, 1977

[54] METHOD FOR NON-DESTRUCTIVE REMOVAL OF SEMICONDUCTOR DEVICES

[75] Inventor: John Reed Crane, Minnetonka, Minn.

[73] Assignee: Sperry Rand Corporation, New York, N.Y.

[22] Filed: Mar. 12, 1976

[21] Appl. No.: 666,522

[52] U.S. Cl. .................................. 29/575; 29/590; 252/514

[51] Int. Cl.[2] ........................................ B01J 17/00

[58] Field of Search .................... 29/575, 589, 590; 252/512, 513, 514, 518.4

[56] References Cited

UNITED STATES PATENTS

| | | | |
|---|---|---|---|
| 3,751,799 | 8/1973 | Reynolds | 29/575 |
| 3,781,975 | 1/1974 | Ressel | 29/590 |
| 3,968,055 | 7/1976 | Palmer | 252/514 |
| 3,969,813 | 7/1976 | Minetti | 29/575 |

*Primary Examiner*—W. Tupman
*Attorney, Agent, or Firm*—Thomas J. Nikolai; Kenneth T. Grace; Marshall M. Truex

[57] ABSTRACT

Semiconductor devices having a conductive lead pattern on the bottom of the device are bonded to conductive pads on a substrate to form an electrical connection therewith. The connection comprises two layers of conductive adhesive plastic separated by a small chip of conductive alloy which melts above the curing temperature of the adhesive plastic. The non-destructive removal of a semiconductor device from the substrate is accomplished by heating only the semiconductor device to be removed until the alloy chip under the device melts, thus, permitting the non-destructive removal of the semiconductor device without the application of force which would tend to destroy the semiconductor device.

10 Claims, 2 Drawing Figures

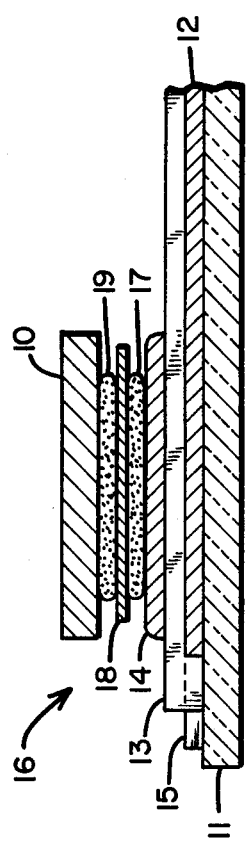
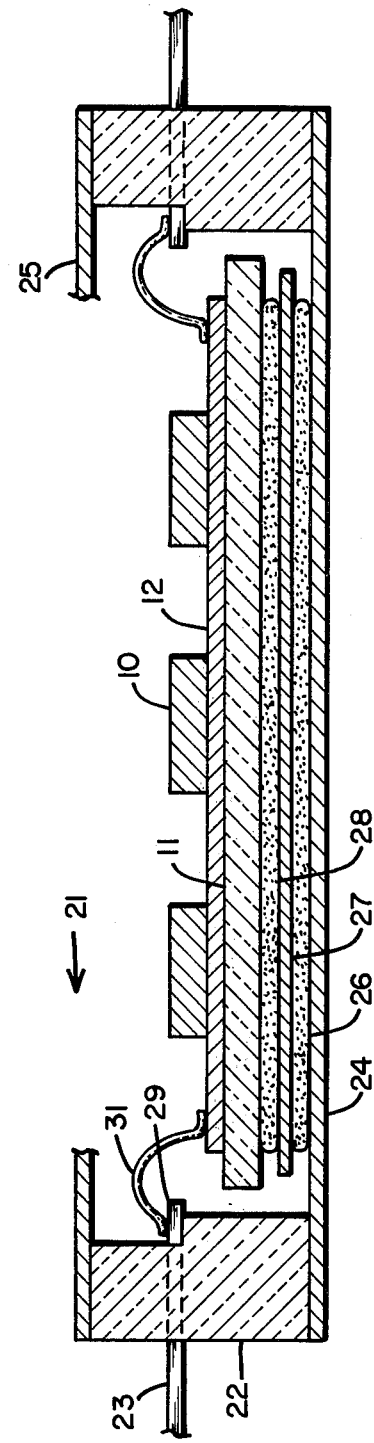

METHOD FOR NON-DESTRUCTIVE REMOVAL OF SEMICONDUCTOR DEVICES

BACKGROUND OF THE INVENTION

Field of the Invention

This invention relates to the manufacture of packaged semiconductor devices or modules. More particularly, this invention relates to the manufacture of hybrid semiconductor packages which include a plurality of individual semiconductor devices bonded to a substrate in a manner which facilitates their non-destructive removal.

Heretofore, semiconductor devices have been made with common anodes or common cathode connections at the base. The individual chips or semiconductor devices have been connected to various types of circuit patterns by solder reflow bonding, soldering, conductive adhesives, wire bonding and by utectic bonding.

It is well known that integrated circuits (I.C.) semiconductor devices may be made having a very large number of active components on a single device. Such devices are being made with several thousand individual active elements on a single chip. The price of an individual component is substantially reduced, the speed of switching is usually increased and the power consumption of the device is usually reduced. Accompanying these desirable features have been lower yields of devices per wafer, increase testing costs and more elaborate processing techniques.

In the data processing equipment industry it has been desirable to mount individual integrated circuit chips in a separate package such as dual in-line pin (DIP) package which enable the package containing the device to be easily mounted by insertion on a printed circuit board. The pins on the IC package and leads from other components on the board may be made permanent by solder wave connecting the pins and leads to a printed circuit board. The removal of a faulty integrated circuit from a fiberglass epoxy printed circuit board is implemented by removing the individual pins or leads on the package from the printed circuit. This enables a new package or device to be inserted in the old connection holes on the printed circuit board when making a repair.

In the data processing equipment industry it has become desirable to reduce the size of printed circuit boards or modules which contain a plurality of the aforementioned integrated circuit packages. The size of the packages containing the individual IC chips cannot be easily reduced and it is desirable to mount the unpackaged integrated circuit on a printed circuit board or substrate to further reduce the size of the module.

Heretofore, a plurality of individual small scale integrated circuits have been mounted on a ceramic substrate and wire bonded to a circuit pattern on the substrate to provide hybrid integrated circuits. Integrated circuits having a larger number of devices have been connected to pads or targets on such substrates at a common base anode or cathode connection by conventional bonding methods. When the large scale integrated circuit devices are found to be faulty and must be removed from the substrate in order to replace the faulty device, the IC device has usually been destroyed during the process of removal and in some instances part of the printed circuit on the substrate has been destroyed. Often when heat is applied to the top of the integrated circuit to remove the faulty device, the heat also destroys adjacent integrated circuit devices which were not faulty before an attempt to remove the faulty device. Excess heat applied to the device and the adjacent printed circuit pattern may cause either the pattern or the adjacent devices to become unusable.

Some microelectronic module packages are too expensive to be thrown away if only a small part of a hybrid integrated circuit fails. Accordingly, it is desirable to be able to open individual packages or modules and replace the defective devices without affecting the printed circuit pattern or adjacent semiconductor devices. It is also desirable to be able to replace a new component in a package which is substantially complete without incurring large repair costs.

SUMMARY OF THE INVENTION

It is a principal object of the present invention to provide a method and means for removing integrated circuit devices from their circuit environment in a manner which does not destroy or affect the circuit environment or the device being removed.

It is another object of the present invention to provide means for removably bonding the base of integrated circuit devices to printed circuits on substrates and to provide means for removably bonding substrates or thick film printed circuits to a base of a package or a container.

In accordance with these and other objects of the present invention there are provided small chips of conductive alloy which are placed in a laminate beneath individual semiconductor devices. The laminates comprise a layer of conductive adhesive plastic on both sides of a conductive alloy chip which releases the alloy chip when the melting point of the alloy chip is reached without the conductive adhesive layers releasing the semiconductor device or the substrate to which they are also bonded. The conductive adhesive may be removed as the need requires. Replacement semiconductive devices may be connected in the same circuit environment by providing a new laminate beneath the semiconductor device.

In a similar manner, a whole substrate having a plurality of semiconductor devices bonded thereon may be bonded to a base of a package or a container by using a laminate comprising a sheet of conductive alloy and one or more layers of conductive adhesive.

BRIEF DESCRIPTION OF THE DRAWINGS

FIG. 1 is an enlarged section in elevation of a semiconductor device bonded to a thick film printed circuit substrate by means of a novel laminate.

FIG. 2 is a section in elevation of a plurality of semiconductor devices mounted on a substrate which is bonded to a ground plane of a hermetically sealed package by means of a novel laminate.

DESCRIPTION OF THE PREFERRED EMBODIMENT

FIG. 1 is an enlarged detail of a section in elevation taken through a semiconductor device 10 which is mounted on a substrate base 11. A preferred substrate for high density packaging is a heat conductive ceramic sheet having a conductive pattern 12 bonded thereto. The conductive circuit pattern 12 may be copper, silver or other conductive material which is bonded to the substrate base 11 and is photolithographically processed and etched to leave a desired printed circuit pattern thereon. Conductive printed circuit pattern 12 may also be deposited as a conductive paste by silk screen processing or other printing techniques. Conductive paste and printing inks are made highly conductive by employing a powdered metal filler such as gold or silver and the deposits are firmly bonded to the substrate by firing the substrate base with the pattern thereon to partially evaporate the binder and make the paste alloy more conductive.

An insulating layer or pattern 13 may be applied over portions of the conductive printed circuit pattern 12 to protect the circuit from mechanical harm or gaseous environment. It will be understood that die bonding pads and leadout patterns for making connections thereto are not covered by the insulating layer.

A die bonding pad 14 is provided for each semiconductor device that is to be attached to the substrate 11. The die bonding pad 14 may be provided as a part of the original foil pattern or the thick film deposited on the substrate. The pads may be deposited through apertures in the insulating layer 13 by a silk screen or printing techniques or by sputtering a conductive material. As long as there is a conductive target or pad interconnection with the printed circuit pattern 12, the present invention laminate may be connected thereto. Multiple layer printed circuit patterns may be employed but have not been illustrated to simplify the explanation of the present invention.

After the substrate 16 is prepared and the circuit thereon hardened, a layer of conductive adhesive 17 may be applied over each die bonding pad 14. Conductive epoxy adhesives such as type 20-1 epoxy made by Ablestick Labs in Gardena, California are suitable for making such layers. The conductive epoxy layer may be silk-screened on or spread with a small spatula shaped tool or thinned out by applying pressure to the semiconductor device after the laminate is completed. It will be understood that the amount of conductive adhesive under each individual chip is very small. The adhesive preferably will not become wet by the alloy chip or sheet when melted so as to form a surface tension bond therewith.

The term "conductive plastic" or "conductive adhesive" is employed herein to cover the preferred embodiment conductive epoxy adhesive. Partially cured sheets of flexible plastics may be employed in lieu of paste adhesive. Such metallice filled sheets may be made very thin and enable the maintenance of a uniform height of the bonding pads on the IC devices for wire bonding purposes.

On top of the first conductive adhesive layer is placed a thin alloy chip 18. The alloy chip 18 is preferably about the same size as the IC chip 10 or smaller and of the order of three to ten mils thick. The alloy chip 18 is preferably made of an alloy which is easily melted at temperatures well below the temperature at which damage to the IC device would occur. The chip 18 is also selected to have thermal and electrical properties which are compatible with the requirements of the IC device being mounted.

A second layer of conductive adhesive 19 is spread on top of the alloy chip 18 and a tested semiconductor device 10 is placed on top of layer 19. A gentle pressure applied to the top of the semiconductor device 10 enables layers 17 and 19 to be made extremely thin. Fixtures or tools for leveling the top of the semiconductor device 10 may be employed to level all of the devices to approximately the same height.

Several IC devices 10 may be mounted on a substrate 16. Usually the devices 10 which are bonded to the substrate have been tested under several different types of conditions and have passed through inspection and/or quality control.

The substrate bearing a plurality of devices 10 mounted thereon by laminate layers 17, 18, 19 may be placed in a curing furnace to cure the conductive adhesive layers. The conductive epoxy adhesive described hereinbefore cures at temperatures below 150° Centigrade and does not begin to deteriorate until well over 160° Centigrade. The alloy chips 18 selected for the preferred embodiment melt between 180° Centigrade and 190° Centigrade, thus, are completely unchanged by the step of curing the epoxy adhesive layers 17 and 19. Adhesive having catalyst promoters which enable self curing may be employed, but are not as desirable as the aforementioned type epoxy adhesive.

After the devices 10 are mounted on a substrate 16, the module may again be tested before being mounted in a package or container. If one of the devices is found to be faulty, it may be removed by applying local heat under the substrate opposite the faulty device. Most integrated circuit devices are not tolerant of high heat but will permit localized heat such as hot inert gas or infrared light to be applied from the top. Heated pickup tools having recessed faces may be employed to grasp the sides of the integrated circuit devices and aid in the removal thereof. Vacuum pencils and tweezers may be employed to remove a device. When the alloy chip 18 melts, the integrated circuit device 10 may be easily removed with a pair of fine tweezers or by one or more of the more elaborate pickup tools referred to above without damage to the integrated circuit device. Preferably the melted alloy does not wet the conductive adhesive so as to create surface tension resistance to its removal.

After the IC devices are mounted on the substrate 16 and tested, they are ready to be packaged. FIG. 2 shows a typical flat pack container 21 which comprises sidewalls 22 having a plurality of leads 23 extending from one or more of the four sidewalls. Some flat pack packages have leads which extend from only two sidewalls 22. Packages having leads 23 extended outward from two sidewalls may be bent downward to provide vertical dual-in-line pin (DIP) packages. Flat pack 21 is provided with a thermally conductive metal or ceramic base seal 24 and a thermally conductive metal or ceramic top seal 25 attached at the side walls by conventional sealants or by welding to provide a hermetic wall seal. Seal 25 is shown in final position after the substrate 16 is mounted in container 21 in the manner to be described hereinafter.

A layer of conductive adhesive 26 is applied to the base seal 24 and is spread to provide an area about the size of the substrate 11. A sheet of conductive alloy 27 is placed over the third conductive adhesive layer 26 and a fourth conductive adhesive layer 28 is placed over the alloy sheet 27. Substrate 11 is pressed into the fourth adhesive layer 28 to conductively bond the base of the substrate 11 to the base of the container 21. The conductive adhesive layers 26 and 28 may be heat cured in an oven. Silver bearing epoxy adhesive of the type described hereinbefore may be employed and will cure below 150° Centigrade. The alloy sheet 27 is selected to have a melting temperature between 160°

Centigrade and 170° Centigrade to provide a sufficient spread of 10° to 20° Centigrade safety factor during curing.

After the packaged substrate is cured and rigidly attached to the base 24 by laminate layers 26, 27 and 28, the leadout paths 15 on the conductive circuit pattern 12 may be wire bonded to post terminals 29 of the leads 23 and to the bonding pads of the chips 10. When the paths 15 and terminals 29 are both goldplated, the wires 31 are preferably made of gold to provide strong bonds which may be made by ultrasonic bonding or thermocompression bonding. Other types of connections and bonding techniques are known in the prior art and may be employed.

If a common anode, common cathode or ground plane is connected to a bonding pad on the top of substrate 16, a wire bond may be made from the base 24 to a blind post connection which connects to the pad.

The plurality of semiconductor devices 10 which are attached to substrate 16 comprise a substantial monetary investment in large scale integrated circuit devices and it may be desirable to again test the final assembly package before the top 25 is sealed thereon. If the tests are conducted through the leads 23 and a device is indicated to be faulty, it may be further tested by checking at its leadout pads to determine if the fault resides with wire bonds. Individual devices 10 may be removed in the manner described hereinbefore by melting the alloy chip 18 with heat from above the device 10. The heat from above must pass through the conductive adhesive layers 17 and 19 as well as the alloy chip 18 before being dissipated in substrate 11 and pattern 12. Even though the alloy sheet 27 melts at a lower temperature than alloy chip 18 it has been found that the individual devices 10 can easily be removed without melting alloy sheet 27.

In the event substrate 11 must be removed, conductive alloy sheet 27 may be heated to its melting temperature without affecting the conductive alloy chips 18.

The proper testing and checking of the devices 10 after being mounted on substrate 16 usually insure that the substrate 16 will not have to be removed from the package 21 and the substrate may be directly attached by a conductive adhesive layer and/or an alloy sheet to base 24. If the substrate 16 is wire bonded to the base 24 through a leadout pad on the top of the substrate 16, an electrically-nonconductive adhesive may be employed beneath the substrate. Preferably, such adhesives employed to attach the substrate to the base 24 permit the substrate 16 to be removed from the package 21 without destruction of the substrate.

An alloy sheet 27 approximately ten mils thick and slightly smaller than the substrate 11 was employed to bond the substrate to base 24. Chips 18 and sheets 27 were cut from sheets of solder preform obtained from Indium Corporation of America. Solder preforms of indium and tin melt as low as 117° Centigrade and indium-tin-lead or tin-lead alloys are available in sheet form which melt up to 314° Centigrade. Other alloys employing silver or gold or antimony with tin or lead or indium can be employed to obtain a desired melting point in the working range described. Preferably, the lower melting point alloy sheets are employed because high temperatures may degrade or destroy the semiconductor devices and the conductive adhesives.

In the event that repair procedures do not require the whole substrate to be removed to rework one or more of the devices 10, the conductive alloy sheet may be made of a higher melting point alloy than the alloy chips under the devices 10. This will enable more heat to be applied to the bottom of the package 21 and will enable less heat to be applied to the top of the devices 10 during removal of an individual device. The unexpected need to remove a substrate from a package may require that the alloy chips under the devices be melted in the process.

If either individual devices 10 or substrates 11 are removed from the assembled package 21, the melted solder alloy chips 18 or sheets 27 may be removed and the exposed adhesive removed or scraped clean so that new devices 10 and/or new substrates 11 may be reassembled in the package 21.

Having explained a preferred embodiment of the present invention, it will be understood that the conductive adhesive layers are preferably heat cured in controlled environmental chambers at temperatures well below the melting point of the conductive alloy chips and sheets employed to facilitate ease of removal of the devices 10 and/or substrates 16.

In the preferred embodiment one inch square alumina ceramic substrates approximately 25 mils thick were employed as substrate bases 11 on which gold silkscreen printed circuits had been applied and fired. Alloy chips 18 about the size of the devices 10 were employed in thicknesses in the range of 3 to 10 mils. It was found that the alloy chips 18 and alloy sheets 27 facilitated the removal of individual semiconductor devices and substrates 16 without the application of force which would ordinarily destroy these components.

What is claimed is:

1. The method of bonding semiconductor devices to a substrate or base to enable their non-destructive removal and replacement, comprising the steps of:
   providing a substrate having a conductive target pad thereon,
   applying a first conductive plastic layer over said conductive target pad,
   applying a conductive alloy chip over said first conductive plastic layer,
   applying a second conductive plastic layer over said conductive alloy chip,
   applying a semiconductor device over said second conductive plastic layer, and
   curing said first and said second conductive plastic layer at a temperature below the melting point of said conductive alloy chip to provide a semiconductive device conductively bonded to said conductive target pad on said substrate.

2. The method as set forth in claim 1 which further includes the step of heating said conductive alloy chip to its melting point and removing said semiconductor device from said substrate.

3. The method as set forth in claim 2 which further includes the steps of:
   removing from said substrate and said semiconductor device the remains of said conductive alloy chip,
   applying conductive plastic to said first conductive plastic layer,
   applying a new conductive alloy chip over said first conductive plastic layer,
   applying conductive plastic over said new conductive alloy chip,
   applying a semiconductor device over said conductive plastic on said new conductive alloy, and curing said conductive plastic at a temperature below the melting point of said new conductive alloy chip.

4. The method set forth in claim 2 which further includes the steps of:
  removing from said substrate and said semiconductor device said first and said second conductive plastic layers and the remains of said conductive alloy chip,
  applying new first and second conductive plastic layers and a new conductive alloy chip to said substrate,
  applying a new semiconductor device over said new second conductive layer, and
  curing said conductive plastic layers at a temperature below the melting point of said new conductive alloy chip.

5. The method as set forth in claim 1 which further includes the steps of:
  providing a package having a conductive base,
  applying a third conductive plastic layer over said base,
  applying a conductive alloy sheet over said third conductive plastic layer,
  applying a fourth conductive plastic layer over said conductive alloy sheet,
  applying said substrate containing said semiconductor device over said fourth conductive plastic layer, and
  curing said conductive plastic layers at a temperature below the melting point of said conductive alloy chip and said conductive alloy sheet.

6. The method as set forth in claim 5 which further includes the step of heating said conductive alloy sheet to its melting point and removing said substrate from said package.

7. The method as set forth in claim 6 which further includes the step of:
  heating an isolated area of said substrate to melt one of a plurality of conductive alloy chips on said substrate, and
  removing one of a plurality of the semiconductor devices from said substrate.

8. The method as set forth in claim 6 wherein the step of heating said conductive alloy sheet to its melting point includes raising the temperature of said conductive alloy chip below its melting point.

9. The method as set forth in claim 7 wherein said substrate contains a plurality of semiconductive devices thereon and the step of heating an isolated area of said substrate to melt one of a plurality of conductive alloy chips does not melt other alloy chips on said substrate.

10. The method as set forth in claim 7 wherein the step of melting said alloy sheet is accomplished in the range of 160° C to 170° C and the step of melting said alloy chip is accomplished in the range of 180° C to 190° C.

* * * * *